(12) United States Patent
Yoshida

(10) Patent No.: US 11,776,903 B2
(45) Date of Patent: Oct. 3, 2023

(54) SEMICONDUCTOR APPARATUS AND METHOD OF MAKING THE SAME

(71) Applicant: SHINKO ELECTRIC INDUSTRIES CO., LTD., Nagano (JP)

(72) Inventor: Kazuhiro Yoshida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/445,227

(22) Filed: Aug. 17, 2021

(65) Prior Publication Data

US 2022/0068806 A1    Mar. 3, 2022

(30) Foreign Application Priority Data

Aug. 25, 2020 (JP) .................................. 2020-141650

(51) Int. Cl.
  *H01L 23/36* (2006.01)
  *H01L 23/522* (2006.01)
  *H01L 23/00* (2006.01)

(52) U.S. Cl.
  CPC .......... *H01L 23/5226* (2013.01); *H01L 23/36* (2013.01); *H01L 24/14* (2013.01)

(58) Field of Classification Search
  CPC ................................ H01L 23/36; H01L 24/14
  See application file for complete search history.

(56) References Cited

U.S. PATENT DOCUMENTS

| | | |
|---|---|---|
| 6,265,771 B1 | 7/2001 | Ference et al. |
| 6,759,737 B2 | 7/2004 | Seo et al. |
| 7,646,093 B2 * | 1/2010 | Braunisch ............ H05K 1/0204 438/117 |
| 9,196,575 B1 * | 11/2015 | Lee .................... H01L 23/49568 |
| 10,515,867 B2 | 12/2019 | Wu et al. |
| 2008/0315398 A1 | 12/2008 | Lo et al. |
| 2009/0294947 A1 * | 12/2009 | Tain .................... H01L 25/0657 257/713 |

(Continued)

FOREIGN PATENT DOCUMENTS

JP    2002-359345    12/2002

OTHER PUBLICATIONS

Extended European Search Report dated Jan. 21, 2022 issued with respect to the corresponding European patent application No. 21192082.2.

*Primary Examiner* — Trang Q Tran
(74) *Attorney, Agent, or Firm* — IPUSA, PLLC

(57) ABSTRACT

A semiconductor apparatus includes an interconnect substrate having a first major surface, a first semiconductor device having a second major surface and mounted to the interconnect substrate, the second major surface opposing the first major surface, a second semiconductor device having a third major surface and a fourth major surface and mounted to the first semiconductor device, the third major surface opposing the first major surface, the fourth major surface opposing the second major surface, a through hole formed through the interconnect substrate at a position overlapping the second semiconductor device in a plan view taken in a thickness direction of the interconnect substrate, and a heatsink member disposed in contact with part of the third major surface, at least a part of the first major surface, and at least a part of a sidewall surface of the through hole.

14 Claims, 15 Drawing Sheets

(56) References Cited

U.S. PATENT DOCUMENTS

| | | | |
|---|---|---|---|
| 2011/0163348 A1* | 7/2011 | Lin | H05K 1/021 |
| | | | 257/E33.075 |
| 2012/0075807 A1 | 3/2012 | Refai-Ahmed et al. | |
| 2015/0255366 A1 | 9/2015 | Chung | |
| 2020/0273772 A1* | 8/2020 | Uppal | H01L 23/3672 |

* cited by examiner

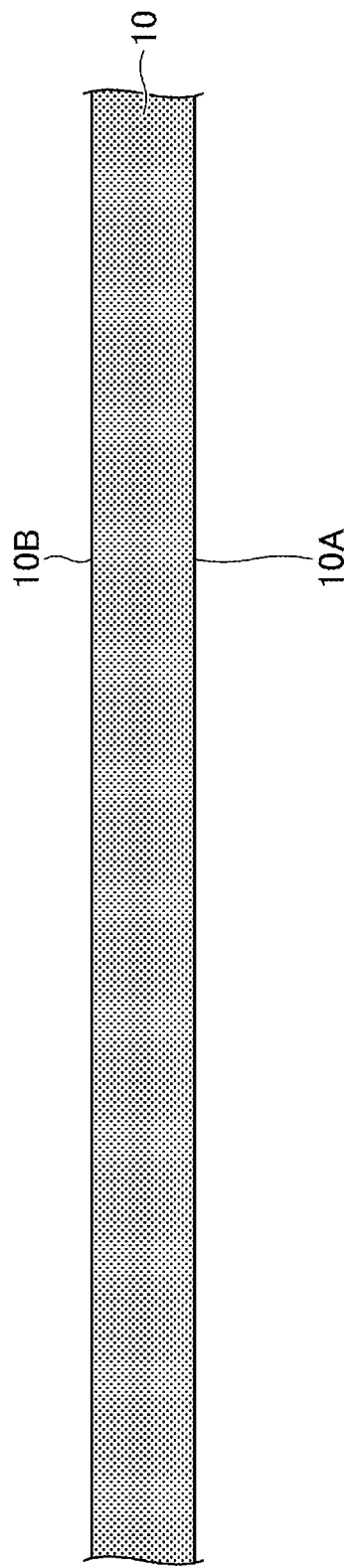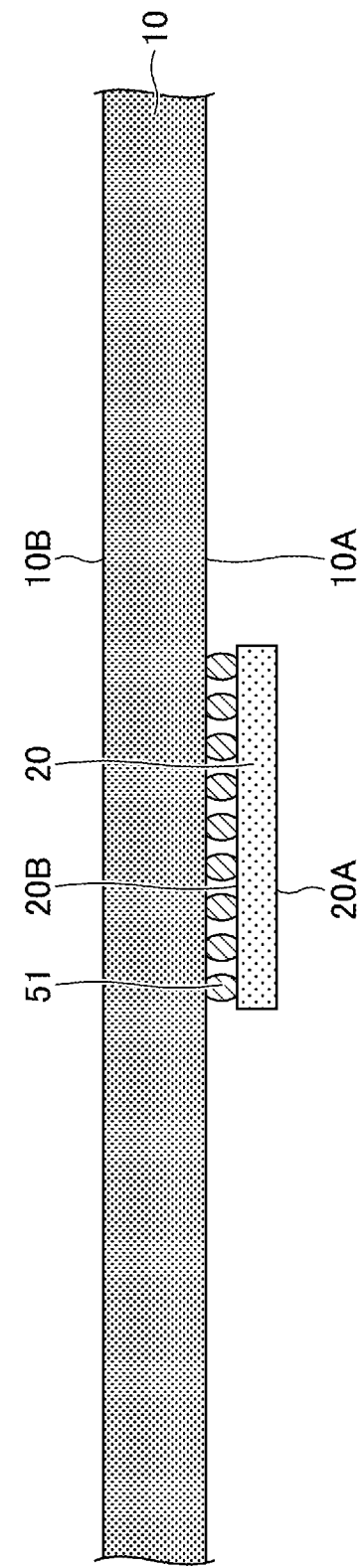

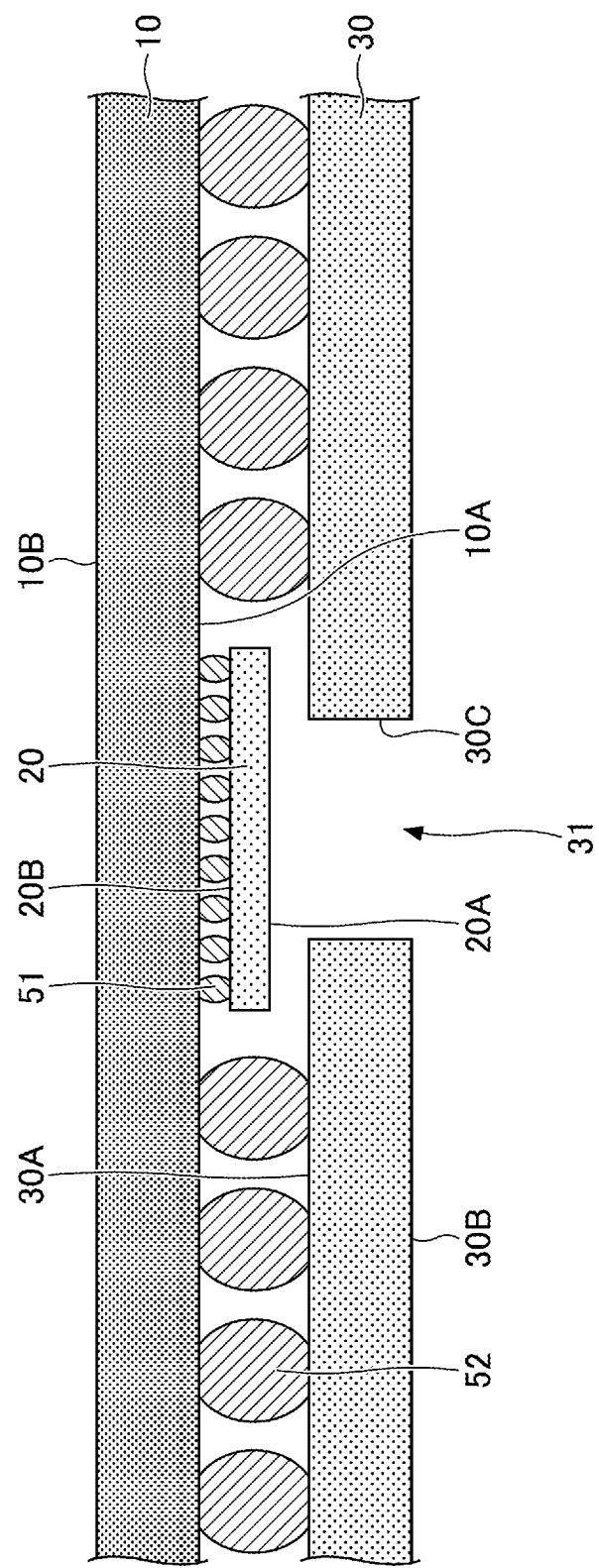

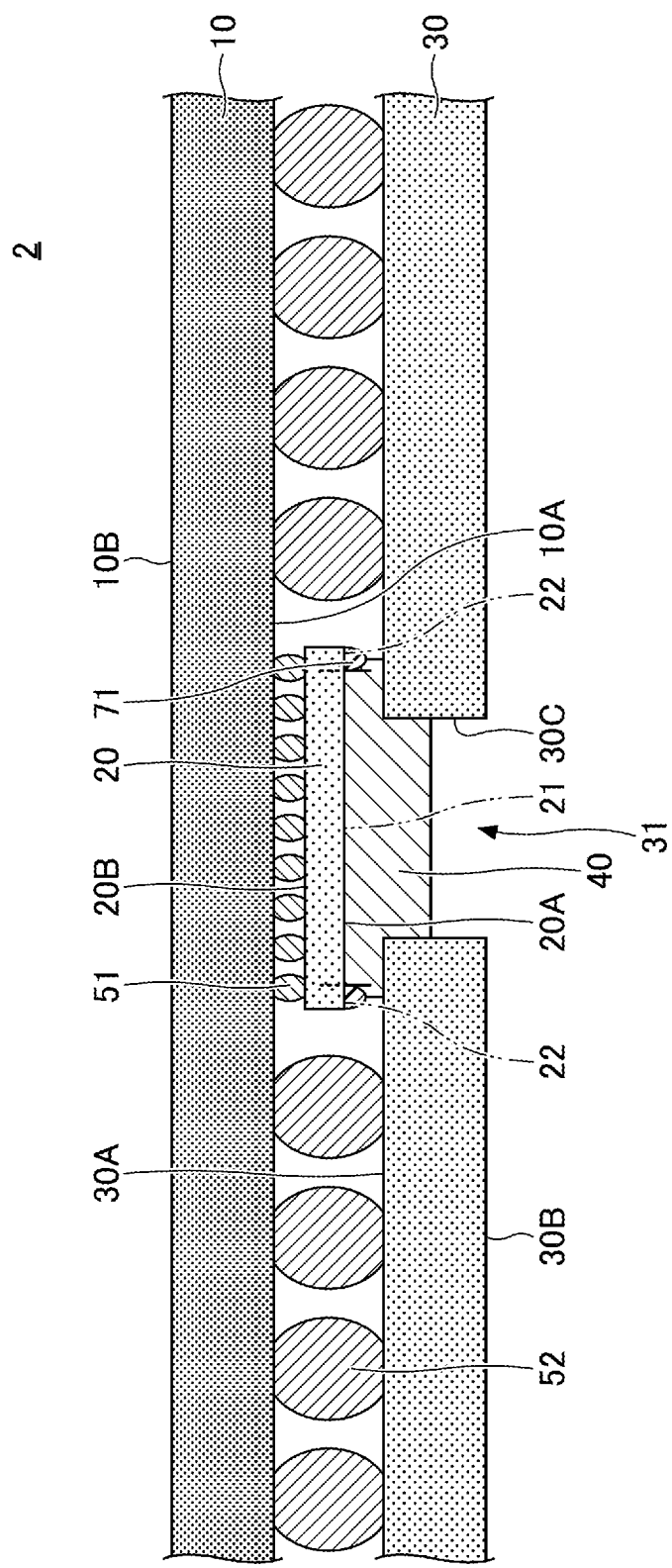

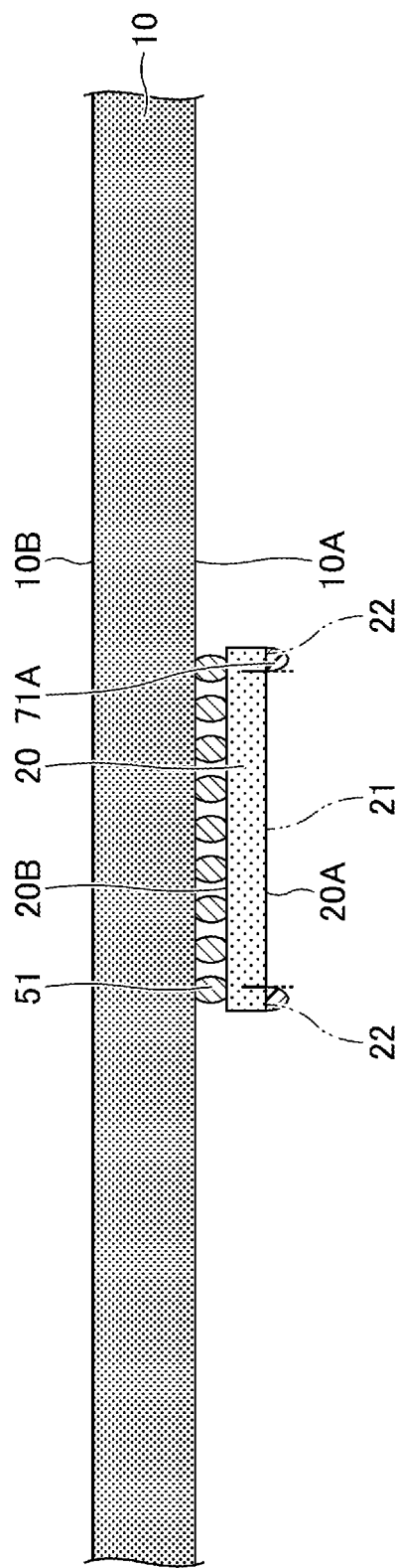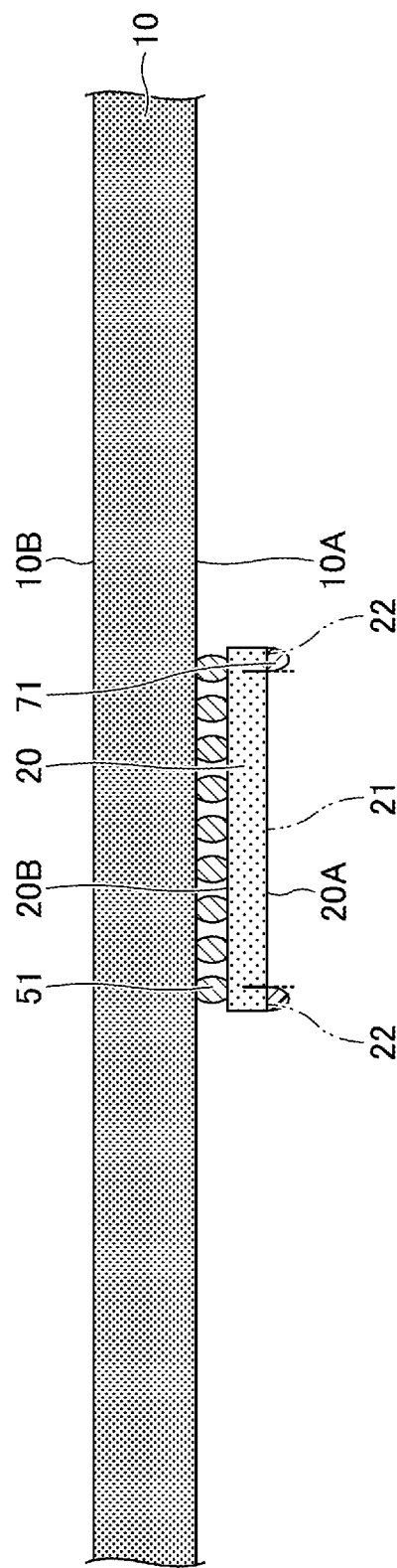

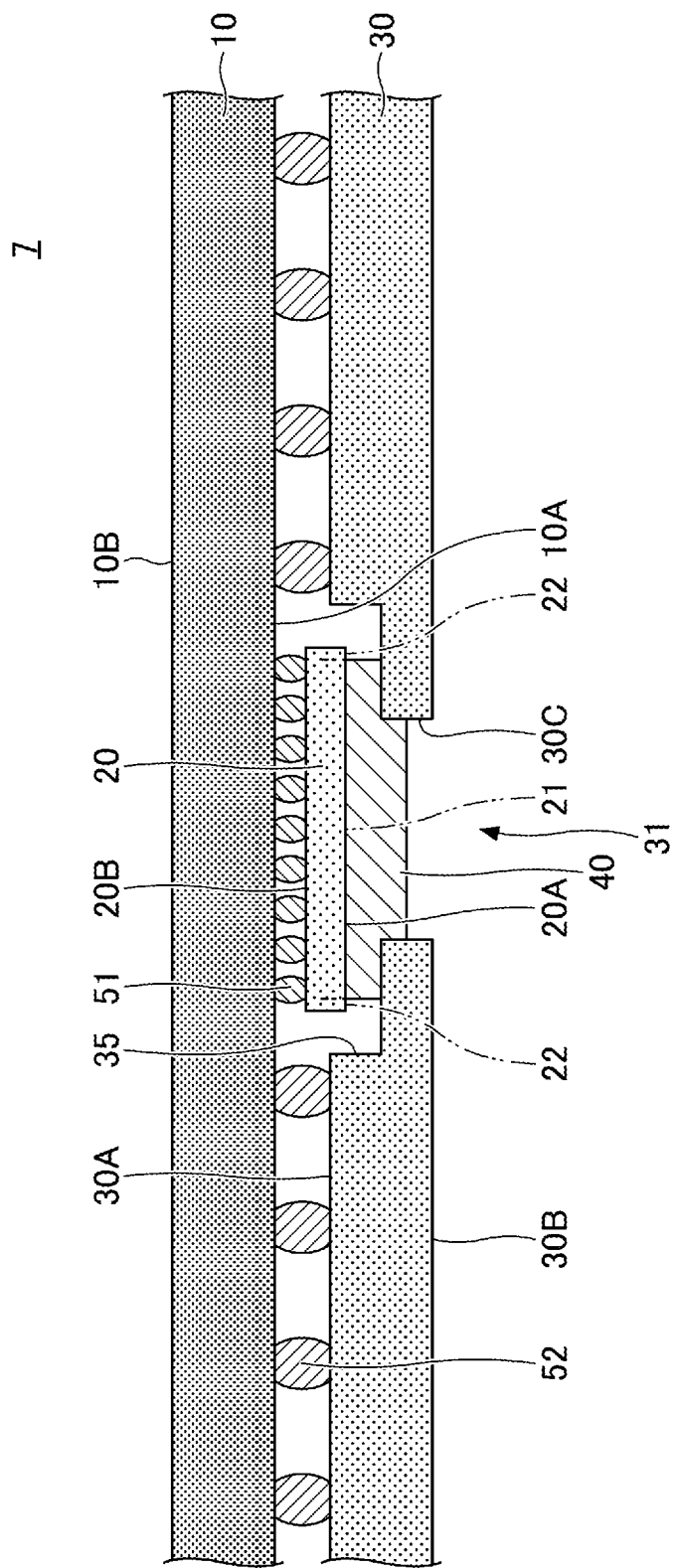

SEMICONDUCTOR APPARATUS AND METHOD OF MAKING THE SAME

CROSS-REFERENCE TO RELATED APPLICATIONS

The present application is based on and claims priority to Japanese Patent Application No. 2020-141650 filed on Aug. 25, 2020, with the Japanese Patent Office, the entire contents of which are incorporated herein by reference.

FIELD

The disclosures herein relate to a semiconductor apparatus and a method of making the same.

BACKGROUND

There is a semiconductor apparatus known in the art in which a first semiconductor chip is flip-chip connected to an interconnect substrate, and a second semiconductor chip is connected to the surface of the first semiconductor chip on the same side as the interconnect substrate (see Patent Document 1, for example). In this semiconductor apparatus, the interconnect substrate has a through hole which accommodates a heatsink plate therein that is spaced apart from the interconnect substrate and in contact with the second semiconductor chip.

Despite the provision of the heatsink plate, the above-noted semiconductor apparatus cannot efficiently dissipate heat generated by the second semiconductor chip.

It may be an object of the present disclosures to provide a semiconductor apparatus and a method of making the same for which heat dissipation efficiency is improved.

RELATED-ART DOCUMENTS

Patent Document

[Patent Document 1] Japanese Laid-Open Patent Publication No. 2002-359345

SUMMARY

According to an aspect of the embodiment, a semiconductor apparatus includes an interconnect substrate having a first major surface, a first semiconductor device having a second major surface and mounted to the interconnect substrate, the second major surface opposing the first major surface, a second semiconductor device having a third major surface and a fourth major surface and mounted to the first semiconductor device, the third major surface opposing the first major surface, the fourth major surface opposing the second major surface, a through hole formed through the interconnect substrate at a position overlapping the second semiconductor device in a plan view taken in a thickness direction of the interconnect substrate, and a heatsink member disposed in contact with part of the third major surface, at least a part of the first major surface, and at least a part of a sidewall surface of the through hole.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 3A and 3B are cross-sectional views illustrating a method of making the semiconductor apparatus according to the first embodiment;

FIG. 4 is a cross-sectional view illustrating the method of making the semiconductor apparatus according to the first embodiment;

FIG. 6 is a cross-sectional view illustrating an example of a semiconductor apparatus according to a second embodiment;

FIGS. 8A and 8B are cross-sectional views illustrating a method of making the semiconductor apparatus according to the second embodiment;

FIG. 15 is a cross-sectional view illustrating an example of a semiconductor apparatus according to a seventh embodiment.

DESCRIPTION OF EMBODIMENTS

In the following, the embodiments will be described with reference to the accompanying drawings. In the specification and drawings, elements having substantially the same functions or configurations are referred to by the same numerals, and a duplicate description thereof may be omitted.

First Embodiment

A first embodiment will be described. The first embodiment is directed to a semiconductor apparatus.

[Structure of Semiconductor Device]

Figure 1:
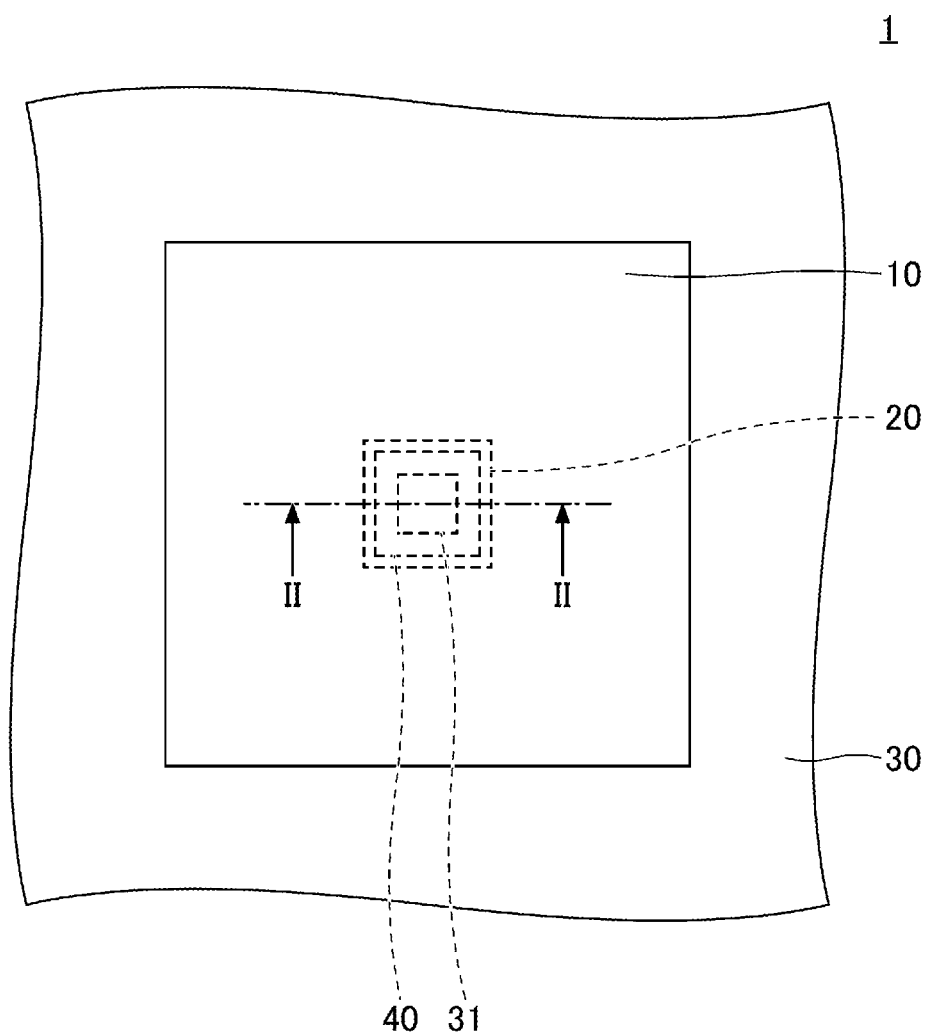
FIG. 1 is a plan view illustrating an example of a semiconductor apparatus according to a first embodiment.
Figure 2:
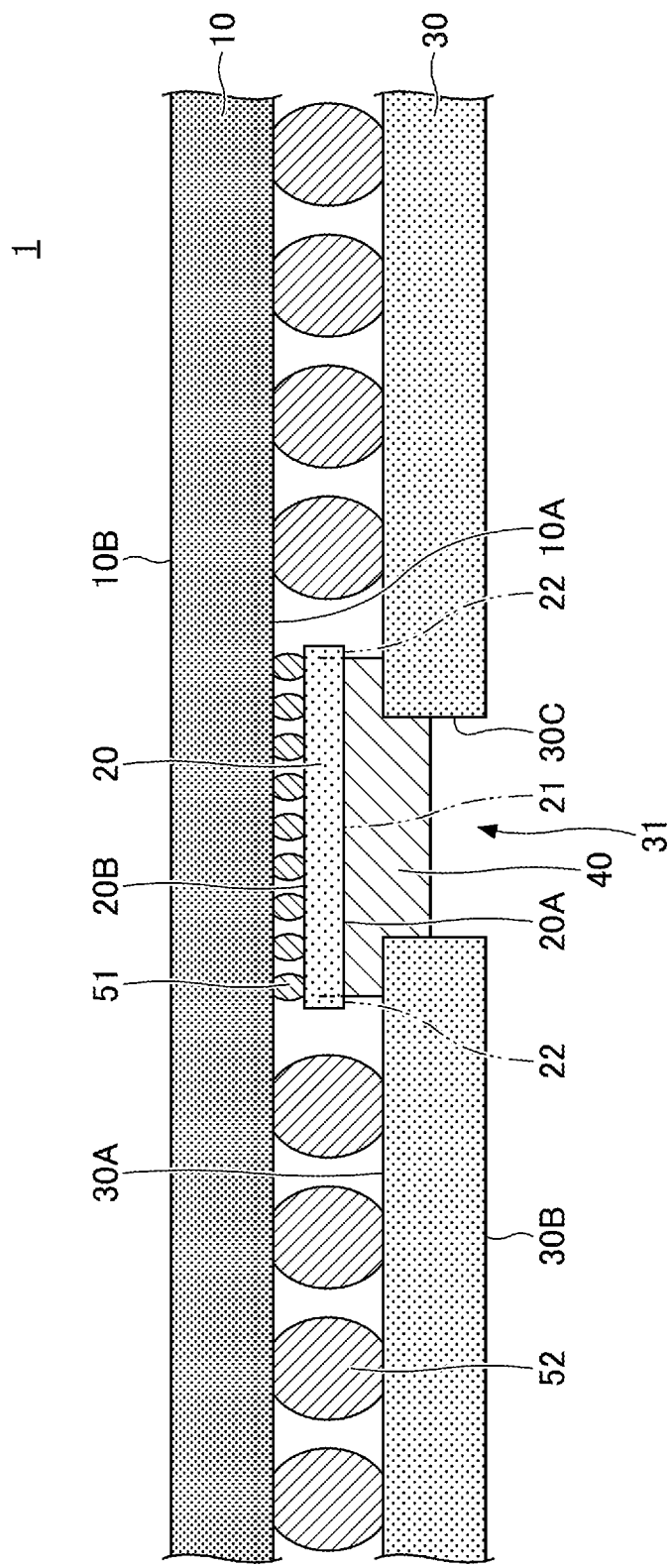
FIG. 2 is a cross-sectional view illustrating an example of the semiconductor apparatus according to the first embodiment.

In the following, the structure of a semiconductor apparatus will be described. FIG. 1 is a plan view illustrating an example of a semiconductor apparatus according to a first embodiment. FIG. 2 is a cross-sectional view illustrating an example of the semiconductor apparatus according to the first embodiment. FIG. 2 illustrates a cross-section taken along the line II-II in FIG. 1.

As illustrated in FIG. 1 and FIG. 2, a semiconductor apparatus 1 of the first embodiment primarily includes an interconnect substrate 30, a first semiconductor device 10, a second semiconductor device 20, and a heatsink member 40.

The interconnect substrate 30 has one major surface 30A and the other major surface 30B. In the present disclosures, the surface 30A may be referred to as an upper surface, and the surface 30B may be referred to as a lower surface. The side where the surface 30A is situated may be referred to as an upper side, and the side where the surface 30B is situated may be referred to as a lower side. The interconnect substrate 30 includes one or more interconnect layers (not shown) and one or more insulating layers (not shown) that are in contact with the respective interconnect layers in the thickness direction. A plurality of first electrode pads (not shown) are disposed on the major surface 30A of the interconnect substrate 30. The major surface 30A is an example of a first major surface. The major surface 30B of the interconnect substrate 30 may have electrode pads formed thereon, which may be connected to a motherboard or the like via solder balls or the like disposed on the electrode pads. In the present disclosures, the "plan view" refers to a view normal to the major surface 30A. It may be noted that the semiconductor apparatus 1 may be used in an upside-down position, or may be placed at any angle.

The first semiconductor device 10 has one major surface 10A and the other major surface 10B. The major surface 10A faces downward, and the major surface 10B faces upward. In the present disclosures, the major surface 10A may be referred to as a lower surface, and the major surface 10B may be referred to as an upper surface. The major surface 10A opposes the major surface 30A of the interconnect substrate 30. A plurality of second electrode pads (not shown) are disposed on the major surface 10A of the first semiconductor device 10 such as to oppose the first electrode pads on the interconnect substrate 30. The first electrode pads of the interconnect substrate 30 and the second electrode pads of the first semiconductor device 10 are connected to each other via respective conductive bumps 52. The conductive bumps 52 are solder bumps, gold bumps, copper bumps, or the like, for example. A plurality of third electrode pads (not shown), which are smaller than the second electrode pads, are also disposed on the major surface 10A of the first semiconductor device 10 in addition to the second electrode pads. The major surface 10A is an example of a second major surface.

The second semiconductor device 20 has one major surface 20A and the other major surface 20B. The major surface 20A faces downward, and the major surface 20B faces upward. In the present disclosures, the major surface 20A may be referred to as a lower surface, and the major surface 20B may be referred to as an upper surface. The major surface 20A faces toward the major surface 30A of the interconnect substrate 30. and the major surface 20B opposes the major surface 10A of the first semiconductor device 10. A plurality of fourth electrode pads (not shown) are disposed on the major surface 20B of the second semiconductor device 20 such as to oppose the third electrode pads on the first semiconductor device 10. The third electrode pads of the first semiconductor device 10 and the fourth electrode pads of the second semiconductor device 20 are connected to each other via respective conductive bumps 51. The conductive bumps 51 are solder bumps, gold bumps, copper bumps, or the like, for example. The major surface 20A is an example of a third major surface, and the major surface 20B is an example of a fourth major surface.

A through hole 31 is formed through the interconnect substrate 30 at the position overlapping the second semiconductor device 20 in the plan view. For example, the through hole 31 is situated inside the perimeter of the major surface 20A in the plan view. The heatsink member 40 is in contact with at least a part of the major surface 30A of the interconnect substrate 30, part of the major surface 20A of the second semiconductor device 20, and at least a part of a sidewall surface 30C of the through hole 31. For example, the heatsink member 40 is situated inside the perimeter of the major surface 20A in the plan view. The major surface 20A of the second semiconductor device 20 includes a first area 21 and a second area 22 adjoining the first area 21. The heatsink member 40 is in contact with the first area 21, but is not in contact with the second area 22. Namely, the heatsink member 40 is partially in contact with the major surface 20A. The heatsink member 40 is inserted into the through hole 31, for example, and is made by curing a thermal interface material (TIM) paste. The heatsink member 40 may be made of an insulator such as a resin or alumina, a conductor such as a metal, graphene, or carbon nanotubes, or both an insulator and a conductor.

In the semiconductor apparatus 1 of the first embodiment, heat generated by the first semiconductor device 10 is transferred to the interconnect substrate 30 mainly through the conductive bumps 52. The heat transferred to the interconnect substrate 30 spreads to the exterior surface of the interconnect substrate 30 such as the major surface 30B through the interconnect layers and the like of the interconnect substrate 30, followed by being dissipated to outside the semiconductor apparatus 1. The heat generated by the second semiconductor device 20 is mainly transferred to the heatsink member 40. The heat transferred to the heatsink member 40 is dissipated to outside, or is transmitted to the interconnect substrate 30. The heat transferred to the interconnect substrate 30 spreads to the exterior surface of the interconnect substrate 30 such as the major surface 30B through the interconnect layers and the like of the interconnect substrate 30, followed by being dissipated to outside the semiconductor apparatus 1. As described above, heat generated by the second semiconductor device 20 is not only dissipated to outside from the heatsink member 40, but also dissipated to outside through the interconnect substrate 30. Accordingly, heat is dissipated with higher efficiency than in the case in which a heatsink plate is only attached to the major surface 20A of the second semiconductor device 20 Further, this arrangement reduces the proportion of heat transferred to the first semiconductor device 10 in the total amount of heat generated by the second semiconductor device 20, thereby reducing a temperature increase in the first semiconductor device 10.

An underfill may be disposed between the major surface 30A and the major surface 10A. In such a case, it is preferable for the heat conductivity of the heatsink member 40 to be higher than the heat conductivity of the underfill.

[Method of Making Semiconductor Apparatus]

In the following, a method of making the semiconductor apparatus 1 will be described. FIGS. 3A and 3B through FIG. 5 are cross-sectional views illustrating the method of making the semiconductor apparatus according to the first embodiment.

As illustrated in FIG. 3A, the first semiconductor device 10 having the major surface 10A and the major surface 10B is provided. A plurality of second electrode pads (not shown) to be connected to the interconnect substrate 30 and a plurality of third electrode pads (not shown) to be connected to the second semiconductor device are disposed on the major surface 10A.

As illustrated in FIG. 3B, the second semiconductor device 20 is provided, and the second semiconductor device 20 is mounted to the first semiconductor device 10. The second semiconductor device 20 has the major surface 20A and the major surface 20B. A plurality of fourth electrode pads (not shown) to be connected to the third electrode pads on the first semiconductor device 10 are disposed on the major surface 20B. The second semiconductor device 20 is mounted such that the major surface 20B of the second semiconductor device 20 opposes the major surface 10A of the first semiconductor device 10 and such that the conductive bumps 51 are used to connect the fourth electrode pads of the second semiconductor device 20 to the third electrode pads of the first semiconductor device 10.

Subsequently, as illustrated in FIG. 4, the interconnect substrate 30 having the through hole 31 formed therethrough is provided, and the first semiconductor device 10 is mounted to the interconnect substrate 30. The interconnect substrate 30 has the major surface 30A and the major surface 30B. A plurality of first electrode pads (not shown) to be connected to the second electrode pads on the first semiconductor device 10 are disposed on the major surface 30A. The first semiconductor device 10 is mounted such that the major surface 10A of the first semiconductor device 10 opposes the major surface 30A of the interconnect substrate 30 and such that the conductive bumps 52 are used to connect the second electrode pads of the first semiconductor device 10 to the first electrode pads of the interconnect substrate 30. The through hole 31 is positioned inside the perimeter of the major surface 20A in the plan view.

Figure 5:
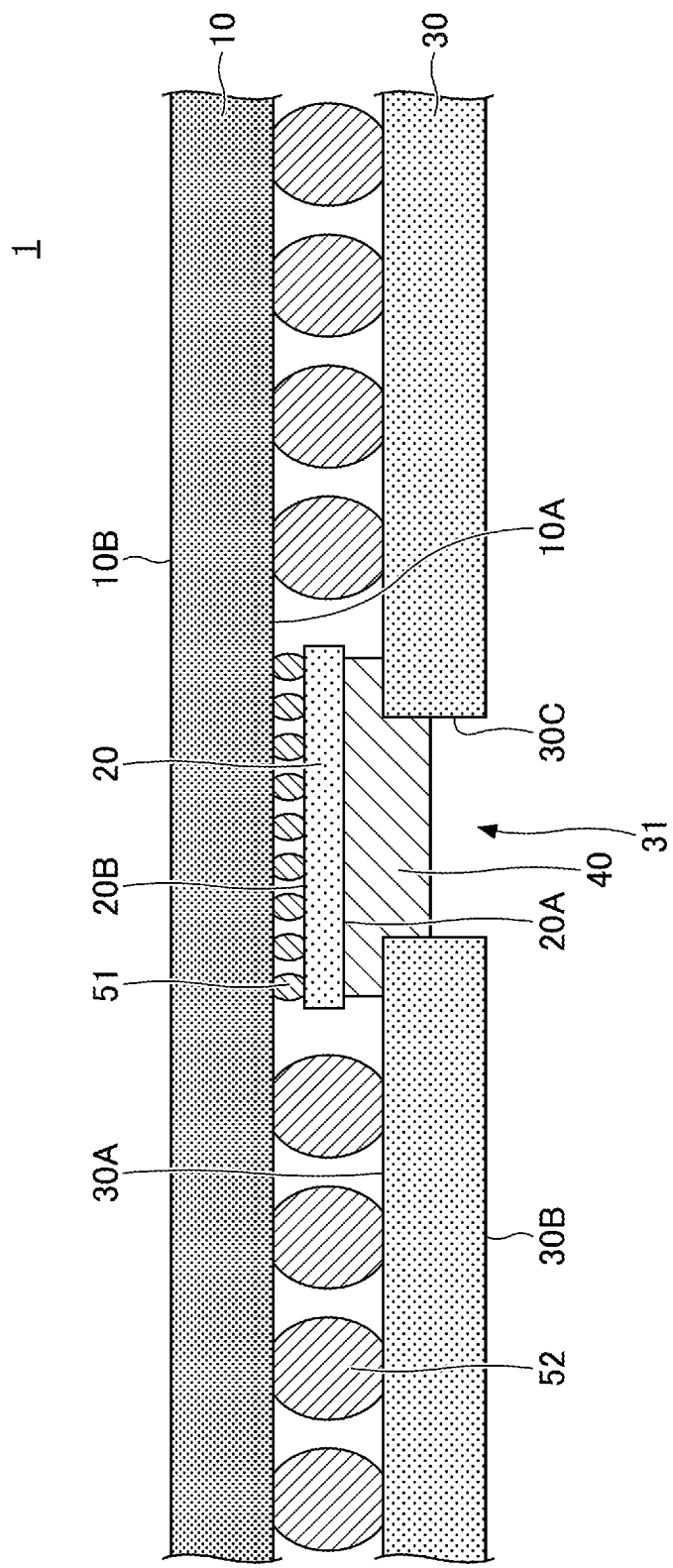
FIG. 5 is a cross-sectional view illustrating the method of making the semiconductor apparatus according to the first embodiment.

Thereafter, as illustrated in FIG. 5, the heatsink member 40 is formed such as to be in contact with part of the major surface 30A of the interconnect substrate 30, part of the major surface 20A of the second semiconductor device 20, and at least a part of the sidewall surface 30C of the through hole 31. In forming the heatsink member 40, a TIM paste or the like is injected into the through hole 31, and is cured by application of heat. The TIM paste or the like contains either an insulator, a conductor, or both, for example.

With this, the making of the semiconductor apparatus 1 is completed.

After the forming of the heatsink member 40, an underfill may be disposed between the major surface 30A and the major surface 10A.

Second Embodiment

A second embodiment will be described. The second embodiment differs from the first embodiment in the configuration of the second semiconductor device and the like. FIG. 6 is a cross-sectional view illustrating an example of a semiconductor apparatus according to the second embodiment.

In a semiconductor apparatus 2 according to the second embodiment, as illustrated in FIG. 6, the major surface 20A of the second semiconductor device 20 includes the first area 21 in contact with the heatsink member 40 and the second area 22 adjoining the first area 21, and a wall 71 containing a resin is provided on the second area 22. The wall 71 is made of an epoxy resin, an acrylic resin, a silicone resin, or the like, for example. Preferably, the second area 22 encloses the first area 21, so that the wall 71 formed on the major surface 20A has a loop shape extending along the outer perimeter of the second semiconductor device 20. The height of the wall 71 is preferably greater than or equal to ½ of the distance between the major surface 30A and the major surface 20A, more preferably greater than or equal to ⅔ thereof, and yet more preferably greater than or equal to ¾ thereof. The wall 71 prevents the heatsink member 40 from coming in contact with the major surface 20A so that the heatsink member 40 is not in contact with the second area 22. The wall 71 is an example of a blocking mechanism.

The remaining configurations are substantially the same as the configurations of the first embodiment.

In the semiconductor apparatus 2 of the second embodiment, the flow of paste is limited by the wall 71 when a TIM paste or the like is injected into the through hole 31 when forming the heatsink member 40. Namely, while the paste wets and spreads over the major surface 30A and the major surface 20A, wetting and spreading over the major surface 20A can be reduced. Reduction of wetting and spreading over the major surface 20A also serves to reduce wetting and spreading over the major surface 30A. Excessive spreading of paste creates the risk that the paste comes in contact with the conductive bumps 52. The paste coming in contact with the conductive bumps 52 may result in reducing the resistance of the conductive bumps 52 to thermal expansion. When the paste has some electrical conductivity, there may be a risk of short-circuiting. As described above, excessive spreading of paste creates the risk that the reliability of the conductive bumps 52 is lowered. In the present embodiment, excessive spreading of paste is reduced, thereby reducing such lowering of reliability of the conductive bumps 52.

Further, the second embodiment also improves heat dissipation efficiency as in the case of the first embodiment.

Figure 7A:
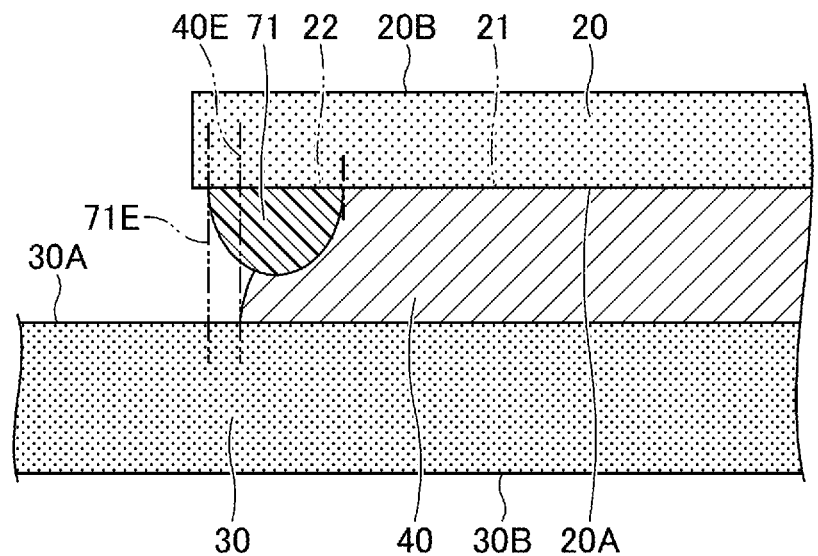
FIGS. 7A and 7B are cross-sectional views illustrating examples of the shape of a heatsink member according to the second embodiment.
Figure 7B:
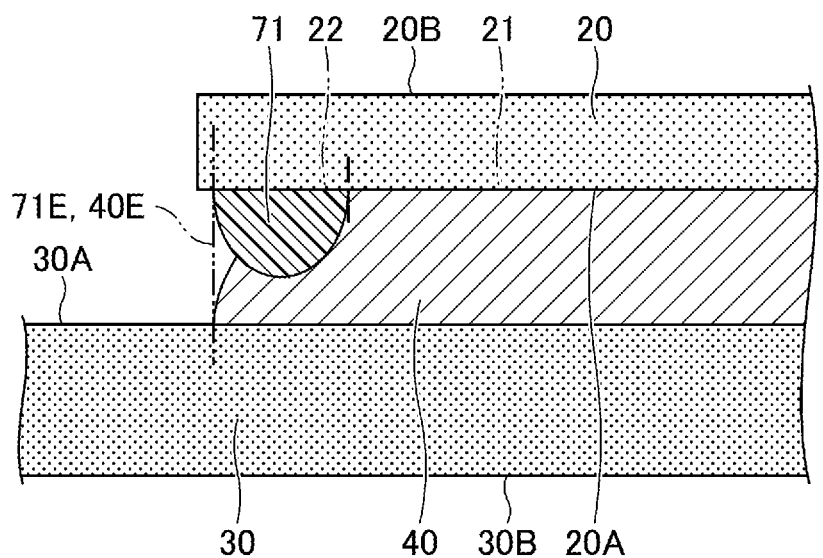

In the following, a description will be given of an example of the shape of the heatsink member 40 according to the second embodiment. FIGS. 7A and 7B are cross-sectional views illustrating examples of the shape of the heatsink member 40 according to the second embodiment.

In the first example illustrated in FIG. 7A, the outer edge 40E of the heatsink member 40 is situated inside the outer edge 71E of the wall 71 in the plan view. In the second example illustrated in FIG. 7B, the outer edge 40E of the heatsink member 40 is aligned with the outer edge 71E of the wall 71 in the plan view. In this manner, the outer edge 40E of the heatsink member 40 is preferably either aligned with the outer edge 71E of the wall 71 or situated inside the outer edge 71E of the wall 71 in the plan view. Further, a TIM paste or the like used to form the heatsink member 40 flows along the surface of the wall 71 and the major surface 30A, so that the border between the surface of the heatsink member 40 and the surface of the wall 71 is likely to be situated inside the border between the surface of the heatsink member 40 and the major surface 30A. Between the wall 71 and the major surface 30A, the lateral surface of the heatsink member 40 may be at an angle to the major surface 30A such as to flare outward toward the bottom at the major surface 30A. In other words, the lateral surface of the structure constituted by the heatsink member 40 and the wall 71 may be such that a recess is formed in the surface perpendicular to the major surface 30A. In the plan view, the outer edge of the interface between the heatsink member 40 and the second semiconductor device 20 may be situated inside the outer edge of the interface between the heatsink member 40 and the interconnect substrate 30. In the plan view, the outer edge 40E of the heatsink member 40 may be situated inside the outer edge of the second semiconductor device 20, for example.

The plane shape of the wall 71 does not have to be a loop shape. For example, in the case of the plan shape of the second semiconductor device 20 being rectangular, the wall 71 may be formed only along three sides, or may be formed only along two sides parallel to each other.

In the following, a description will be given of a method of making the semiconductor apparatus 2 according to the second embodiment. FIGS. 8A and 8B are cross-sectional views illustrating the method of making the semiconductor apparatus according to the second embodiment.

In substantially the same manner as in the first embodiment, the processes up to the mounting of the second semiconductor device 20 to the first semiconductor device 10 are performed (see FIGS. 3A and 3B). As illustrated in FIG. 8A, a dispenser or the like is used to deposit an uncured resin paste 71A on the second area 22 of the major surface 20A. The resin paste 71A is then heated and cured to form the wall 71 as illustrated in FIG. 8B. Subsequently, in substantially the same manner as in the first embodiment, the processes at and after the mounting of the first semiconductor device 10 to the interconnect substrate 30 are performed (see FIG. 4 and FIG. 5).

With this, the making of the semiconductor apparatus 2 is completed.

Third Embodiment

Figure 9:
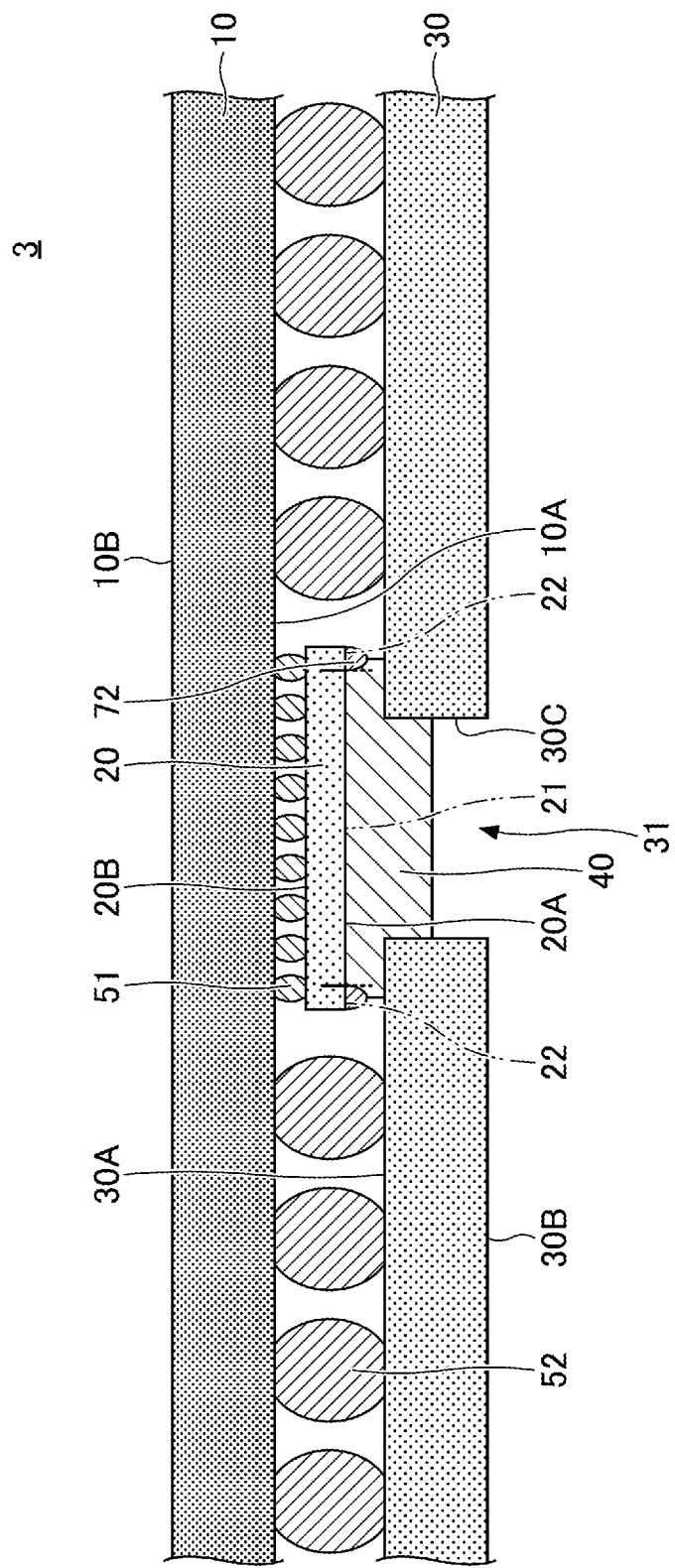
FIG. 9 is a cross-sectional view illustrating an example of a semiconductor apparatus according to a third embodiment.

A third embodiment will be described. The third embodiment differs from the second embodiment in the configuration of the wall. FIG. 9 is a cross-sectional view illustrating an example of a semiconductor apparatus according to the third embodiment.

In a semiconductor apparatus 3 according to the third embodiment, as illustrated in FIG. 9, a wall 72 containing metal is disposed in the second area 22, in place of the wall 71 of the second embodiment. The wall 72 is made of silver, copper, gold, or the like, for example. The height of the wall 72 is preferably greater than or equal to ½ of the distance between the major surface 30A and the major surface 20A, more preferably greater than or equal to ⅔ thereof, and yet more preferably greater than or equal to ¾ thereof. The wall 72 prevents the heatsink member 40 from coming in contact with the major surface 20A so that the heatsink member 40 is not in contact with the second area 22. The wall 72 is an example of a blocking mechanism.

The remaining configurations are substantially the same as the configurations of the second embodiment.

In the semiconductor apparatus 3 of the third embodiment, the flow of paste is limited by the wall 72 when a TIM paste or the like is injected into the through hole 31 when forming the heatsink member 40. As in the second embodiment, excessive spreading of paste is reduced, thereby reducing the lowering of reliability of the conductive bumps 52.

Further, the third embodiment also improves heat dissipation efficiency as in the case of the first embodiment.

Figure 10A:
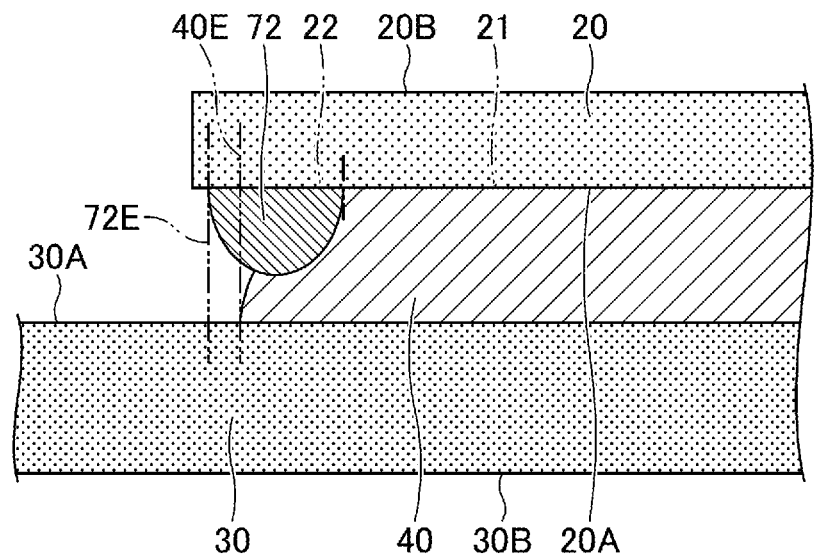
FIGS. 10A and 10B are cross-sectional views illustrating examples of the shape of a heatsink member according to the third embodiment.
Figure 10B:
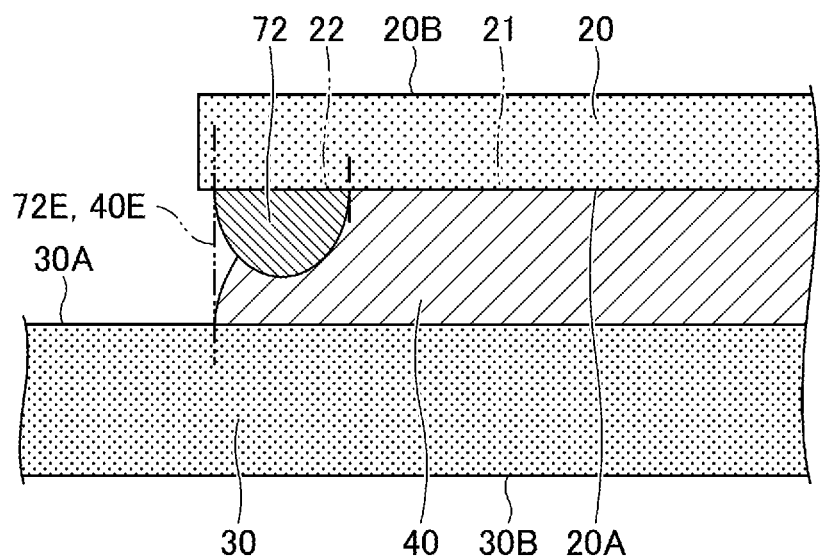

In the following, a description will be given of an example of the shape of the heatsink member 40 according to the third embodiment. FIGS. 10A and 10B are cross-sectional views illustrating examples of the shape of the heatsink member 40 according to the third embodiment.

In the third example illustrated in FIG. 10A, the outer edge 40E of the heatsink member 40 is situated inside the outer edge 72E of the wall 72 in the plan view. In the fourth example illustrated in FIG. 10B, the outer edge 40E of the heatsink member 40 is aligned with the outer edge 72E of the wall 72 in the plan view. In this manner, the outer edge 40E of the heatsink member 40 is preferably either aligned with the outer edge 72E of the wall 72 or situated inside the outer edge 72E of the wall 72 in the plan view. Further, a TIM paste or the like used to form the heatsink member 40 flows along the surface of the wall 72 and the major surface 30A, so that the border between the surface of the heatsink member 40 and the surface of the wall 72 is likely to be situated inside the border between the surface of the heatsink member 40 and the major surface 30A. Between the wall 72 and the major surface 30A, the lateral surface of the heatsink member 40 may be at an angle to the major surface 30A such as to flare outward toward the bottom at the major surface 30A. In other words, the lateral surface of the structure constituted by the heatsink member 40 and the wall 72 may be such that a recess is formed in the surface perpendicular to the major surface 30A. In the plan view, the outer edge of the interface between the heatsink member 40 and the second semiconductor device 20 may be situated inside the outer edge of the interface between the heatsink member 40 and the interconnect substrate 30. In the plan view, the outer edge 40E of the heatsink member 40 may be situated inside the outer edge of the second semiconductor device 20, for example.

When making the semiconductor apparatus 3 of the third embodiment, a past containing metal may be used as the material of the wall 72, in place of a resin paste used as the material of the wall 71, for example.

Fourth Embodiment

Figure 11:
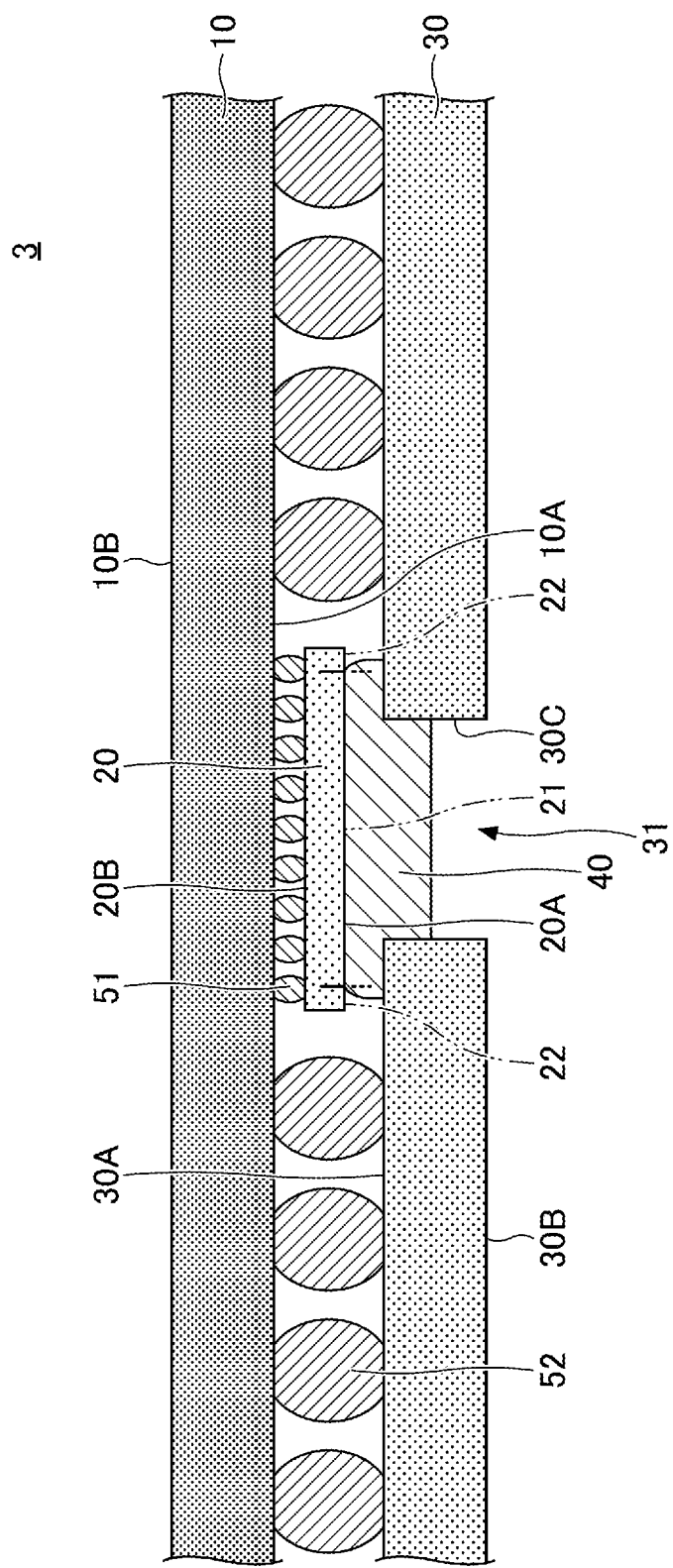
FIG. 11 is a cross-sectional view illustrating an example of a semiconductor apparatus according to a fourth embodiment.

A fourth embodiment will be described. The fourth embodiment differs from the second embodiment in the configuration of the second semiconductor device and the like. FIG. 11 is a cross-sectional view illustrating an example of a semiconductor apparatus according to the fourth embodiment.

In a semiconductor apparatus 4 according to the fourth embodiment, as illustrated in FIG. 11, neither the wall 71 of the second embodiment nor the wall 72 is provided in the second area 22, and the second area 22 is formed as a liquidphobic surface. For example, the second area 22 may have been subjected to plasma processing or exposed to deep ultraviolet light. The liquidphobic surface prevents the heatsink member 40 from coming in contact with the major surface 20A so that the heatsink member 40 is not in contact with the second area 22. The liquidphobic surface is an example of a blocking mechanism. Between the major surface 20A and the major surface 30A, the lateral surface of the heatsink member 40 may be at an angle to the major surface 30A such as to flare outward toward the bottom at the major surface 30A.

The remaining configurations are substantially the same as the configurations of the second embodiment.

In the semiconductor apparatus 4 of the fourth embodiment, the flow of paste is limited by the liquidphobic surface of the second area 22 when a TIM paste or the like is injected into the through hole 31 when forming the heatsink member 40. As in the second embodiment, excessive spreading of paste is reduced, thereby reducing the lowering of reliability of the conductive bumps 52.

Further, the fourth embodiment also improves heat dissipation efficiency as in the case of the first embodiment.

Figure 12:
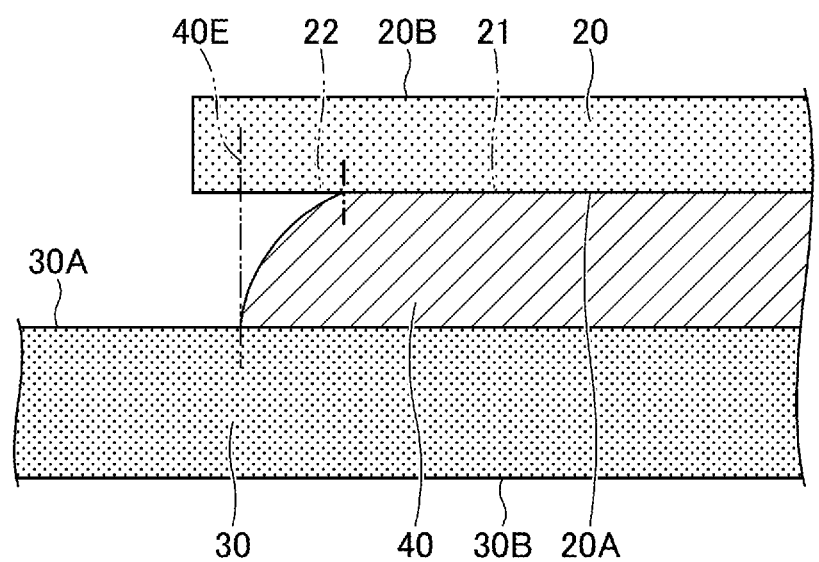
FIG. 12 is a cross-sectional view illustrating an example of the shape of a heatsink member according to the fourth embodiment.

In the following, a description will be given of an example of the shape of the heatsink member 40 according to the fourth embodiment. FIG. 12 is a cross-sectional view illustrating an example of the shape of the heatsink member 40 according to the fourth embodiment.

In the fifth example as illustrated in FIG. 12, the lateral surface of the heatsink member 40 between the major surface 20A and the major surface 30A is at an angle to the major surface 30A such as to flare outward toward the bottom at the major surface 30A. In the plan view, the outer edge of the interface between the heatsink member 40 and the second semiconductor device 20 may be situated inside the outer edge of the interface between the heatsink member 40 and the interconnect substrate 30. In the plan view, the outer edge 40E of the heatsink member 40 may be situated inside the outer edge of the second semiconductor device 20, for example.

When making a semiconductor apparatus 4 of the fourth embodiment, neither the wall 71 nor the wall 72 is formed, and the second area 22 is subjected to plasma processing or exposed to deep ultraviolet light to be made into a liquid-phobic surface, for example.

Fifth Embodiment

Figure 13:
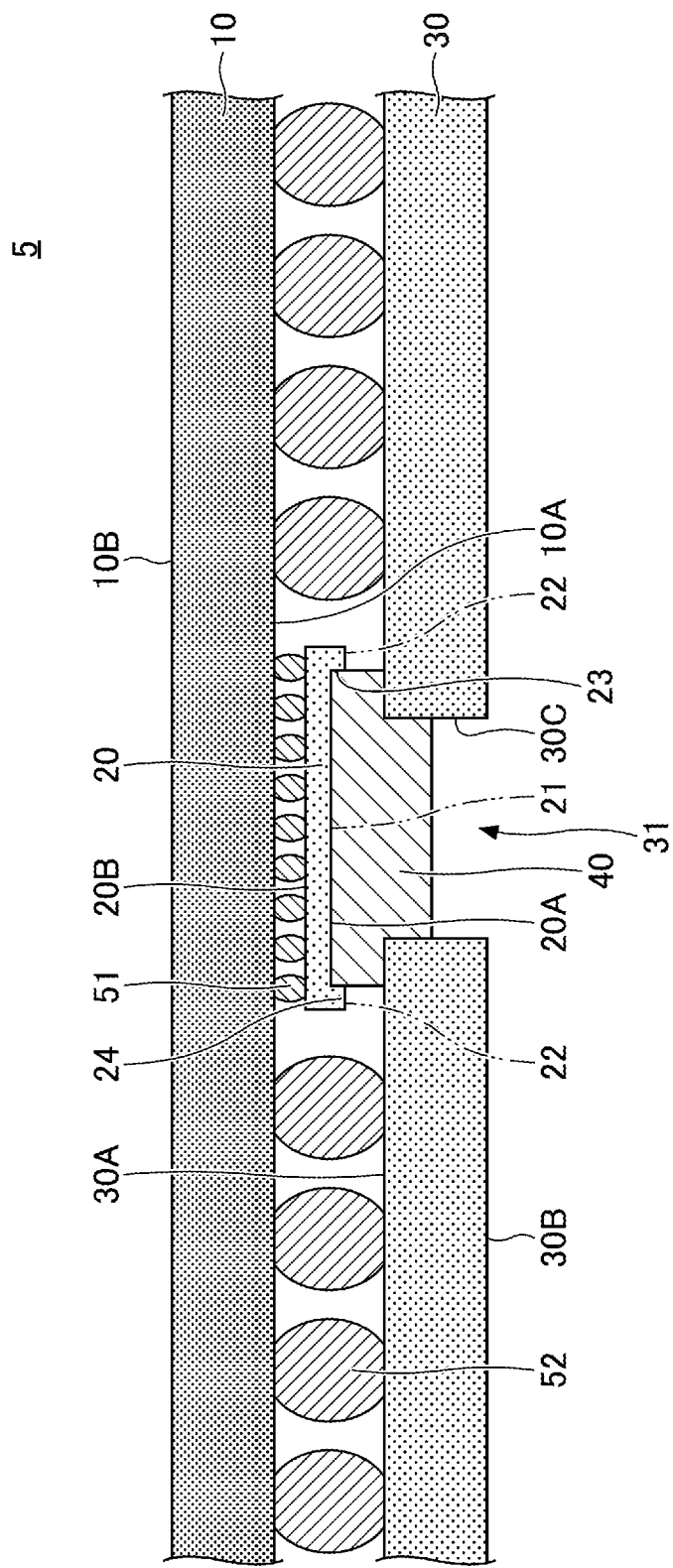
FIG. 13 is a cross-sectional view illustrating an example of a semiconductor apparatus according to a fifth embodiment.

A fifth embodiment will be described. The fifth embodiment differs from the first embodiment in the configuration of the second semiconductor device and the like. FIG. 13 is a cross-sectional view illustrating an example of a semiconductor apparatus according to the fifth embodiment.

In a semiconductor apparatus 5 according to the fifth embodiment, as illustrated in FIG. 13, a recess 23 is formed in the first area 21, and a bulge 24 adjoining the recess 23 is formed in the second area 22. The heatsink member 40 is in contact with the second semiconductor device 20 at the interior surface of the recess 23. The recess 23 is an example of a first recess, and the bulge 24 is part of the blocking mechanism.

The remaining configurations are substantially the same as the configurations of the first embodiment.

In the semiconductor apparatus 5 of the fifth embodiment, the flow of paste is limited by the bulge 24 when a TIM paste or the like is injected into the through hole 31 when forming the heatsink member 40. As in the second embodiment, excessive spreading of paste is reduced, thereby reducing the lowering of reliability of the conductive bumps 52.

Further, the fifth embodiment also improves heat dissipation efficiency as in the case of the first embodiment.

The shapes of the recess 23 and the bulge 24 are not limited to a particular shape. In the plan view, the bulge 24 may be formed in a loop shape. Alternatively, in the case of the plan shape of the second semiconductor device 20 being rectangular, the bulge 24 may be formed only along two sides parallel to each other.

When making the semiconductor apparatus 5 of the fifth embodiment, the second semiconductor device 20 may be processed to have the recess 23 before being mounted to the first semiconductor device 10, for example. The recess 23 may be formed by dry etching or wet etching using an etching mask. Alternatively, a dicing saw may be used to form the recess 23 in conjunction with a dicing process before or after dicing the wafer.

Any one of the second through fourth embodiments maybe combined with the fifth embodiment.

Sixth Embodiment

Figure 14:
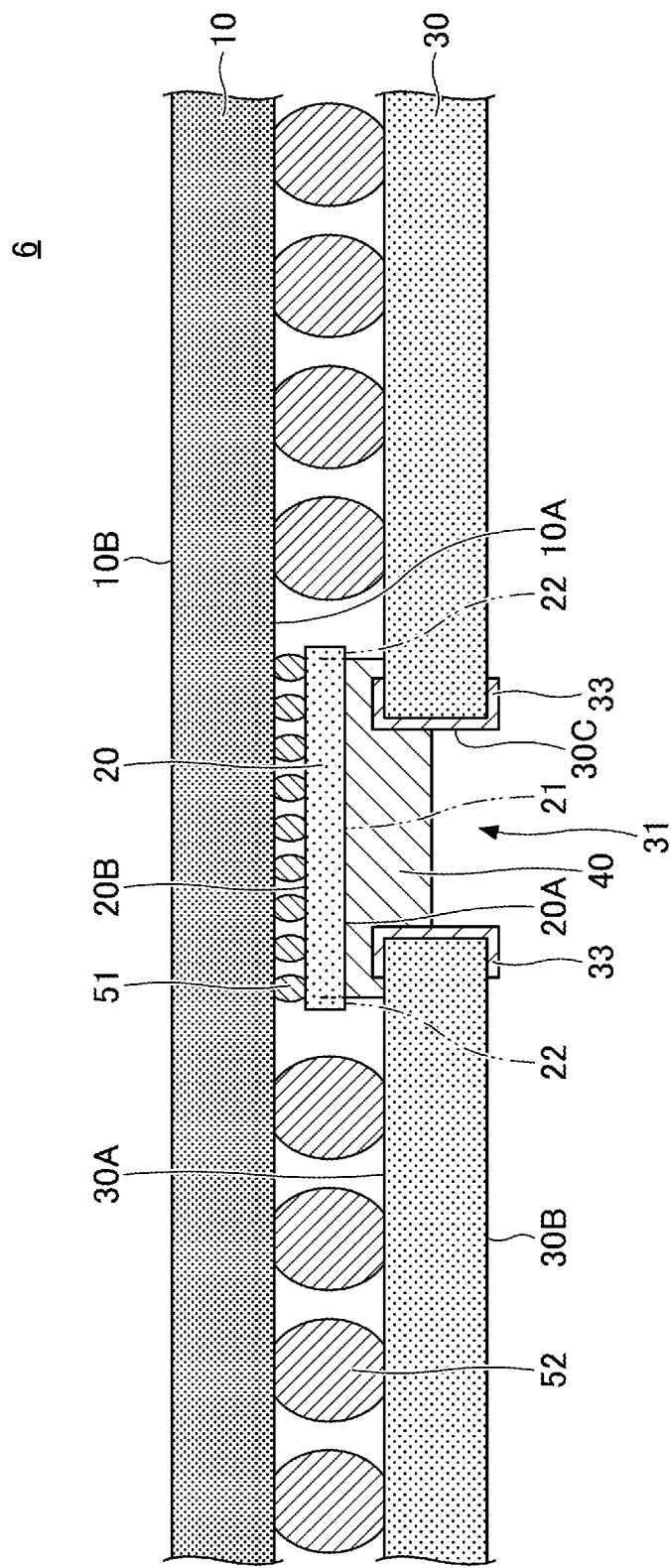
FIG. 14 is a cross-sectional view illustrating an example of a semiconductor apparatus according to a sixth embodiment.

A sixth embodiment will be described. The sixth embodiment differs from the first embodiment in the configuration of the interconnect substrate and the like. FIG. 14 is a cross-sectional view illustrating an example of a semiconductor apparatus according to the sixth embodiment.

In a semiconductor apparatus 6 of the sixth embodiment, as illustrated in FIG. 14, the interconnect substrate 30 has an external interconnect layer 33 that is exposed at the sidewall surface 30C of the through hole 31. The external interconnect layer 33 is electrically connected to one or more internal interconnect layers (not shown) such as a ground layer formed inside the interconnect substrate 30. The external interconnect layer 33 is disposed all over the sidewall surface 30C. The heatsink member 40 is in contact with at least a portion of the external interconnect layer 33. The external interconnect layer 33 contains copper or a copper alloy, for example.

The remaining configurations are substantially the same as the configurations of the first embodiment.

In the semiconductor apparatus 6 of the sixth embodiment, heat is transmitted from the heatsink member 40 to the interconnect substrate 30 through the external interconnect layer 33. The external interconnect layer 33 has higher thermal conductivity than the insulating layers. In the semiconductor apparatus 6, thus, heat is transmitted from the heatsink member 40 to the interconnect substrate 30 with increased efficiency. The interconnect substrate 30 may include an internal interconnect layer, such as a ground layer, having a relatively large area, and the external interconnect layer 33 may be connected to this internal interconnect layer. In such a case, heat is readily dissipated inside the interconnect substrate 30 at high speed, which achieves a further increased heat dissipation efficiency.

When making the semiconductor apparatus 6 of the sixth embodiment, the external interconnect layer 33 may be formed after forming the through hole during the fabrication of the interconnect substrate 30, for example.

Any one of the second through fourth embodiments maybe combined with the sixth embodiment. The fifth embodiment maybe combined with the sixth embodiment.

Seventh Embodiment

A seventh embodiment will be described. The seventh embodiment differs from the first embodiment in the configuration of the interconnect substrate and the like. FIG. 15 is a cross-sectional view illustrating an example of a semiconductor apparatus according to the seventh embodiment.

In a semiconductor apparatus 7 of the seventh embodiment, as illustrated in FIG. 15, the major surface 30A of the interconnect substrate 30 has a cavity 35 formed therein that continues from the through hole 31 and that is wider than the second semiconductor device 20 in the plan view. The major surface 20A of the second semiconductor device 20 is situated closer to the major surface 30B of the interconnect substrate 30 than is the upper end of the cavity 35. The bottom surface of the cavity 35 is part of the major surface 30A as defined in the present disclosures. The heatsink member 40 is in contact with at least a part of the bottom surface of the cavity 35, part of the major surface 20A of the second semiconductor device 20, and at least a part of the sidewall surface 30C of the through hole 31.

The distance between the major surface 30A and the major surface 10A is less than that of the first embodiment. Accordingly, the height of the conductive bumps 52 is less than that of the first embodiment.

The remaining configurations are substantially the same as the configurations of the first embodiment.

The seventh embodiment also improves heat dissipation efficiency as in the case of the first embodiment. Further, the dimension of the semiconductor apparatus 7 of the seventh embodiment in the thickness direction is readily made smaller than that of the semiconductor apparatus 1 of the first embodiment.

When making the semiconductor apparatus 7 of the seventh embodiment, the cavity 35 may be formed during the fabrication of the interconnect substrate 30, for example.

Any one of the second through fourth embodiments maybe combined with the seventh embodiment. The fifth and/or sixth embodiments maybe combined with the seventh embodiment.

According to at least one embodiment, heat dissipation efficiency is improved.

The present disclosures non-exhaustively include the subject matter set out in the following clauses.

[Clause 1] A method of making a semiconductor apparatus, comprising:
  providing an interconnect substrate having a first major surface and a through hole formed therethrough;
  providing a first semiconductor device having a second major surface;
  providing a second semiconductor device having a third major surface and a fourth major surface;
  mounting the second semiconductor device to the first semiconductor device such that the fourth major surface opposes the second major surface;
  mounting the first semiconductor device to the interconnect substrate such that the second major surface and the third major surface oppose the first major surface, while ensuring alignment such that the second semiconductor device overlaps the through hole in a plan view taken in a thickness direction of the interconnect substrate; and
  forming a heatsink member in contact with part of the third major surface, at least a part of the first major surface, and at least a part of a sidewall surface of the through hole.

[Clause 2] The method as claimed in clause 1, wherein the forming a heatsink member includes:
  injecting a paste to become the heatsink member into the through hole; and
  curing the paste by heat.

[Clause 3] The method as claimed in clause 2, wherein the third major surface includes a first area in contact with the heatsink member and a second area adjoining the first area, and a blocking mechanism is provided to prevent the paste from wetting and spreading in the second area.

[Clause 4] The method as claimed in clause 3, wherein the second area encloses the first area.

[Clause 5] The method as claimed in clause 3 or 4, wherein the blocking mechanism includes a wall containing resin which is formed on the third major surface.

[Clause 6] The method as claimed in clause 3 or 4, wherein the blocking mechanism includes a wall containing metal which is formed on the third major surface.

[Clause 7] The method as claimed in clause or 4, wherein the blocking mechanism includes a liquidphobic surface provided on the third major surface.

[Clause 8] The method as claimed in clause 3 or 4, wherein the third major surface has a first recess in the first area, and the blocking mechanism includes a bulge adjoining the first recess.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor apparatus, comprising:
  an interconnect substrate having a first major surface;
  a first semiconductor device having a second major surface and mounted to the interconnect substrate, the second major surface opposing the first major surface;
  a second semiconductor device having a third major surface and a fourth major surface and mounted to the first semiconductor device, the third major surface opposing the first major surface, the fourth major surface opposing the second major surface;
  a through hole formed through the interconnect substrate at a position overlapping the second semiconductor device in a plan view taken in a thickness direction of the interconnect substrate; and
  a heatsink member disposed in surface-to-surface contact with part of the third major surface, at least a part of the first major surface, and at least a part of a sidewall surface of the through hole,
  wherein in the plan view, the heatsink member is situated inside an outer perimeter of the second semiconductor device and smaller than the second semiconductor device,
  wherein the heatsink member includes a first portion and a second portion, the first portion being disposed outside the through hole, and the second portion being disposed inside the through hole, the first portion being wider than the second portion in a direction parallel to the first major surface, the first portion being in surface-to-surface contact with at least the part of the first major surface, the second portion being in surface-to-surface contact with at least the part of the sidewall surface of the through hole, and
  wherein an upper portion of the through hole is filled with the second portion of the heatsink member, and a lower portion of the through hole is hollow.

2. The semiconductor apparatus as claimed in claim 1, wherein the third major surface includes a first area in contact with the heatsink member and a second area adjoining the first area, and a blocking mechanism is provided in the second area to prevent the heatsink member from coming in contact with the third major surface.

3. The semiconductor apparatus as claimed in claim 2, wherein the second area encloses the first area.

4. The semiconductor apparatus as claimed in claim 2, wherein the blocking mechanism includes a wall containing resin which is formed on the third major surface.

5. The semiconductor apparatus as claimed in claim 2, wherein the blocking mechanism includes a wall containing metal which is formed on the third major surface.

6. The semiconductor apparatus as claimed in claim 2, wherein the blocking mechanism includes a liquidphobic surface provided on the third major surface.

7. The semiconductor apparatus as claimed in claim 2, wherein the third major surface has a first recess in the first area, and the blocking mechanism includes a bulge adjoining the first recess.

8. The semiconductor apparatus as claimed in claim 1, wherein the interconnect substrate includes an interconnect layer exposed at the sidewall surface of the through hole, and the heatsink member is in contact with at least a portion of the interconnect layer.

9. The semiconductor apparatus as claimed in claim 1, wherein the first major surface has a second recess that continues from the through hole and that is wider than the second semiconductor device in the plan view taken in the thickness direction of the interconnect substrate.

10. The semiconductor apparatus as claimed in claim 1, wherein the heatsink member contains a metal.

11. The semiconductor apparatus as claimed in claim 10, wherein the heatsink member further contains a resin.

12. The semiconductor apparatus as claimed in claim 1, wherein the second semiconductor device is situated between the first major surface of the interconnect substrate and the second major surface of the first semiconductor device.

13. The semiconductor apparatus as claimed in claim 1, wherein the interconnect substrate and the first semiconductor device are electrically connected to each other via one or more first conductive bumps, and the first semiconductor device and the second semiconductor device are electrically connected via one or more second conductive bumps.

14. The semiconductor apparatus as claimed in claim 1, wherein a first part of the heatsink member overlaps the through hole in the plan view, and a second part of the heatsink member does not overlap the through hole in the plan view, the first part being thicker than the second part in the thickness direction of the interconnect substrate.

\* \* \* \* \*